United States Patent [19]

Pruett

[11] 3,836,399

[45] Sept. 17, 1974

[54] PHOTOVOLTAIC DIODE WITH FIRST IMPURITY OF CU AND SECOND OF CD, ZN, OR HG

[75] Inventor: George R. Pruett, Richardson, Tex.

[73] Assignee: Texas Instruments Incorporated, Dallas, Tex.

[22] Filed: Mar. 26, 1971

[21] Appl. No.: 156,692

Related U.S. Application Data

[63] Continuation of Ser. No. 10,084, Feb. 16, 1970, abandoned, which is a continuation of Ser. No. 370,145, May 14, 1964, abandoned.

[52] U.S. Cl. .................................................. 136/89
[51] Int. Cl. .......................................... H01l 15/02
[58] Field of Search ...................................... 136/89

[56] References Cited

UNITED STATES PATENTS

| | | | |
|---|---|---|---|
| 2,725,315 | 11/1955 | Fuller | 148/1.5 |
| 2,798,989 | 7/1957 | Welker | 148/1.5 |
| 2,810,870 | 10/1957 | Hunter | 148/1.5 |
| 2,861,018 | 11/1958 | Fuller | 148/1.5 |
| 2,929,859 | 3/1960 | Loferski | 136/89 |
| 3,028,500 | 4/1962 | Wallmark | 136/89 X |
| 3,043,725 | 7/1962 | Anderson | 148/33.5 |
| 3,224,913 | 12/1965 | Ruehrwein | 136/89 X |
| 3,290,175 | 12/1966 | Cusano | 136/89 |

OTHER PUBLICATIONS

Stone et al., In Progress In Astronautics & Rocketry, Vol. III, Energy Conversion For Space Power, Snyder(Ed)., Academic Press., April, 1961, pp. 299–315.
Lucovsky et al., J. Opt., Soc. of Amer. Vol. 50, Oct. 1960, pp. 979–983.
Wolf, M. (II) Proc. of the I.R.E. July 1960, pp. 1246, 1254–1261.
Wolf, M. (I) Proc. of the I.R.E. May 1963, pp. 674–688.
Wallmark, J. T. Proc. of the I.R.E. April, 1957, pp. 474–483.

*Primary Examiner*—A. B. Curtis
*Attorney, Agent, or Firm*—Harold Levine; Edward J. Connors; William E. Hiller

[57] ABSTRACT

A photodiode is disclosed which may be made by diffusing into N-type indium-antimonide a fast diffusing dopant impurity; such as copper; in a low concentration; e.g., below $5 \times 10^{15}$ atoms per cubic centimeter; at the high conductivity surface; and a slowly diffusing dopant impurity; such as zinc, cadmium, or mercury; in a high concentration; e.g., $5 \times 10^{17}$ atoms per cubic centimeter; at the high conductivity surface to form (a) a first region of uniform N-type conductivity indium-antimonide, (b) a second, or copper-diffused P-type conductivity, region contiguous with the N-type indium-antimonide and forming a P-N Junction therewith and decreasing in concentration and conductivity toward the P-N junction, (c) a third, high conductivity, region containing both the slowly diffusing zinc, cadmium, or mercury, and the copper, spaced from the P-N junction, contiguous with the high conductivity portion of the copper-diffused region, being substantially thinner than the copper-diffused region, and being of P-type conductivity. Ohmic contacts are affixed to the first region and the third region.

7 Claims, 2 Drawing Figures

PATENTED SEP 17 1974 3,836,399

Figure 1:
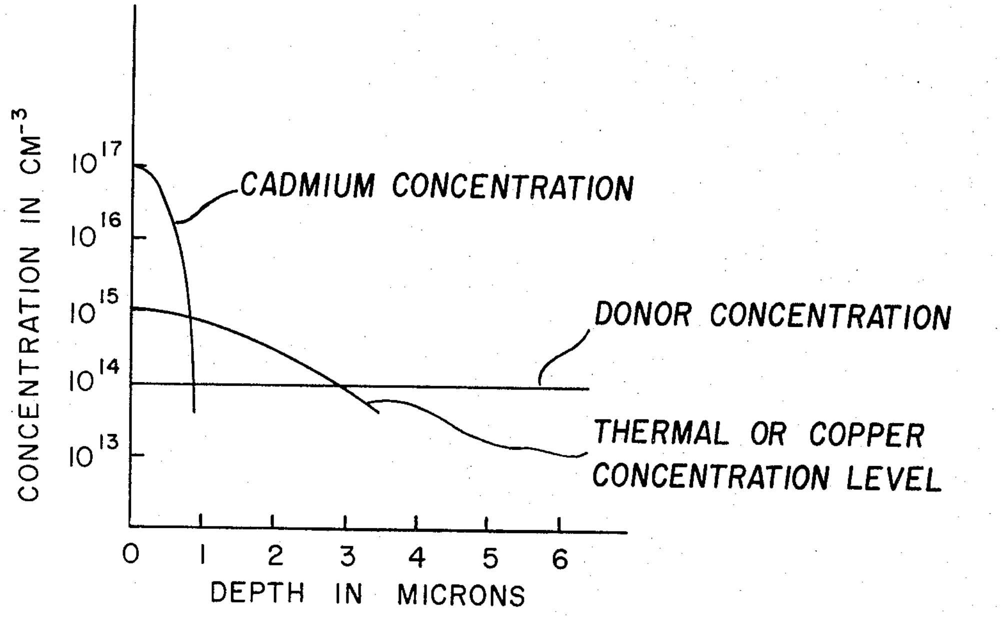

GEORGE R. PRUETT
INVENTOR.

BY Robert C Peterson
Attorney

PHOTOVOLTAIC DIODE WITH FIRST IMPURITY OF CU AND SECOND OF CD, ZN, OR HG

This is a streamlined continuation of application Ser. No. 10,084 filed Feb. 16, 1970 which is in turn a stream lined continuation of application Ser. No. 370,145 filed May 14, 1964 both now abandoned and entitled "DIFFUSED P-N JUNCTION DIODES AND METHODS OF DIFFUSION THEREFOR."

This invention relates to diffused P-N junction diodes and methods of diffusion therefor, and more particularly to photovoltaic diodes which are sometimes referred to as photo diodes.

Various semiconductor and compound semiconductor materials are quite useful in making photovoltaic diodes, and particularly for photovoltaic diodes responsive to electromagnetic radiation. Such materials, for example, are silicon, germanium, gallium arsenide, indium arsenide, indium antimonide, etc. Many of the semiconductor materials useful for making P-N junction photo diodes or photovoltaic diodes are particularly sensitive to electromagnetic radiation in the infrared wavelength.

Photo diodes or photovoltaic diodes are operated with a reverse bias voltage sufficient to avoid a net surrent flow through the diode under normal background radiation on the electromagnetic radiation-sensitive or active surface of the diode. Under bias conditions with electromagnetic radiation excitation or photon absorption, a hole-electron pair is generated at the active surface of the diode. If the photons generate electrons as minority carriers at the active surface, the majority carriers concurrently generated will travel toward the contact region on the active surface of the diode. In the P-N junction, an electrostatic field is established as a barrier for holes in the P-type region and for electrons in the N-type region. This barrier allows a separation of the charge and a means of detection for photons where this charge is transferred to the separate contacts. To generate a signal, each photon must generate a hole-electron pair with each electron and hole diffusing to its respective contact.

In a photovoltaic diode, if the active surface has a high resistivity, the majority carriers generated by photon absorption at a distance from the contact will be impeded from reaching the contact and hence, diffuse across the P-N junction as the lowest energy path and recombine with a minority carrier. Also, if the active surface has a high resistivity, the electrostatic field generated by the applied bias will decrease as the distance from the contact increases; hence, the electrostatic field will not separate the charge and holes will diffuse across the junction. In addition, the electrons will not be accelerated to and through the junction.

For a photovoltaic diode, the signal quantum efficiency would be unity if one photon produces one hole-electron pair separated by the P-N junction and the hole and electron each diffuses to its respective contact.

Thus, it will be apparent that if the active surface has a high resistivity, then as the distance from the contact on the active surface of a photovoltaic diode to the photon absorption area on the active surface increases, the signal quantum efficiency decreases.

The invention herein disclosed provides a method of increasing the signal quantum efficiency and the electrostatic field by providing a thin, low resistivity surface layer and then a gradually increasing resistivity to the depth of the P-N junction. This is achieved in the invention by several techniques. For example, the resistivity gradient according to the invention may be achieved by concurrently diffusing a very slow diffusing, high solid solubility dopant material along with a relatively fast diffusing, lower solid solubility dopant material into a semiconductor to form a P-N junction. Also, the concentration gradient or profile could be achieved by diffusing a conductivity-affecting impurity into a wafer at a low temperature for a long period of time to effect a low carrier concentration while forming the P-N junction, and then for a short period of time diffusing the impurity at a high temperature to effect a high carrier concentration surface layer.

Many different diffusion techniques may be used in accordance with the invention to provide a photovoltaic diode having an extremely low resistance surface layer to provide a low resistance conductive path along the active surface to the contact for majority carriers while also providing an improved electrostatic field to accelerate minority carriers across the P-N junction. Thus, an increased utilization of photons striking the surface of the photovoltaic diode is achieved over the entire active surface, thereby increasing the signal quantum efficiency.

It is therefore an object of the invention to provide a photo diode having an enhanced signal quantum efficiency.

It is another object of the invention to provide a photovoltaic diode comprising a body of semiconductor material having a region of a relatively thin, high conductivity surface layer with a sharp decrease in conductivity just below the surface layer and then a gradually decreasing conductivity throughout the remainder of said region to form P-N junction.

It is a further object of the invention to provide a photovoltaic diode having a relatively uniform potential across the device from any point on the active surface and thus a uniform diffusion current density.

It is another object of the invention to provide a compound semiconductor photovoltaic diode having an enhanced signal quantum efficiency comprising a compound semiconductor body having a first region of one-type conductivity and a second contiguous region of opposite-type conductivity containing a relatively thin, high conductivity surface layer with a sharp decrease in conductivity just below the surface layer and then a gradually decreasing conductivity throughout the remainder of said contiguous region to form the P-N junction.

Another object of the invention is to provide an indium antimonide photovoltaic diode having an enhanced signal quantum efficiency comprising an indium antimonide body of one-type conductivity having a region of opposite-type conductivity containing a relatively thin, high conductivity surface layer with a sharp decrease in conductivity just below the surface layer and then a gradually decreasing conductivity throughout the remainder of said region to form the P-N junction.

Still another object of the invention is to provide an indium antimonide photovoltaic diode having an enhanced signal quantum efficiency comprising an indium antimonide body having a first region of one-type conductivity with a uniform impurity carrier concentration therein and a second region of opposite-type conductivity diffused therein, said second region containing a thin surface layer of high impurity concentration and immediately below said surface layer an intermediate layer containing a low impurity concentration gradually decreasing throughout the remainder of said second region.

It is another object of the invention to provide a method for making a photovoltaic diode with an enhanced signal quantum efficiency comprising concurrently diffusing a high solid solubility, slow diffusing impurity and a relatively low solid solubility, rapidly diffusing impurity into a semiconductor material to form a P-N junction diode having a high conductivity, sharply defined surface layer in the diffused material.

It is another object of the invention to provide a method of making a compound semiconductor photovoltaic diode having an enhanced signal quantum efficiency comprising diffusing a high solid solubility, slow diffusing impurity into said compound semiconductor wafer concurrently undergoing thermal diffusion.

It is another object of the invention to provide a method of making an indium antimonide photovoltaic diode having an enhanced signal quantum efficiency comprising concurrently diffusing cadmium and copper into an N-type indium antimonide semiconductor wafer.

It is still another object of the invention to provide a method of making a photovoltaic indium antimonide diode having an enhanced signal quantum efficiency comprising diffusing cadmium into an N-type indium antimonide wafer concurrently undergoing thermal diffusion.

It is another object of the invention to provide a method of making an indium antimonide photovoltaic diode having an enhanced signal quantum efficiency comprising concurrently diffusing a high solubility, slow diffusing P-type impurity and a relatively low solubility, rapidly diffusing P-type impurity into an N-type indium antimonide semiconductor wafer.

It is a further object of the invention to provide an indium antimonide photovoltaic diode having an enhanced signal quantum efficiency comprising concurrently diffusing a high solubility, slow diffusing N-type impurity and a relatively low solubility, rapidly diffusing N-type impurity into a P-type indium antimonide semiconductor wafer.

Figure 2:
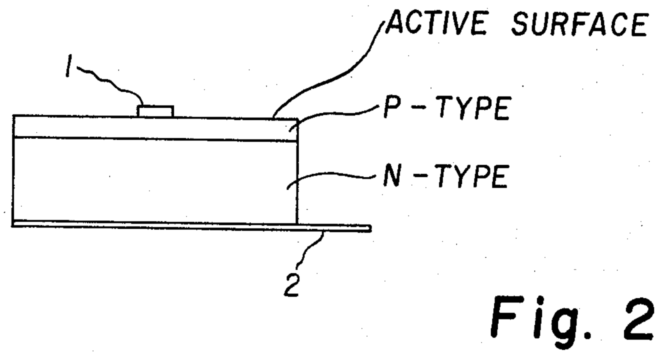

Other objects and advantages of the invention will be appreciated from the detailed description following hereinafter in conjunction with the appended claims and the drawings wherein:

FIG. 1 illustrates typical impurity concentrations diffused into a P-N junction photovoltaic diode; and FIG. 2 illustrates, schematically, a photovoltaic diode according to the invention having an enhanced signal quantum efficiency.

Referring specifically to FIGS. 1 and 2, the invention will be disclosed with the preferred embodiment of indium antimonide as the photovoltaic diode. An indium antimonide semiconductor wafer preferably of N-type conductivity having a low resistivity such as would be achieved with a donor impurity concentration of $10^{14}$ carriers per $cm^3$ is cleaned in accordance with well-known cleaning techniques for semiconductors. It should be appreciated that often the well-known techniques of cleaning semiconductors leave surfaces with copper impurities thereon. In such a case, as will be observed later, thermal diffusion of such a conductivity-affecting impurity may replace the rapid diffusion, low solid solubility impurity utilized in accordance with the invention.

The precleaned wafer is then sealed into a clean, quartz ampoule along with a relatively high solid solubility impurity that is a very slow diffusant and a relatively low solid solubility impurity that is a relatively rapid diffusant. If thermal diffusion for the low solid solubility impurity is to be relied upon, only the high solid solubility, slow diffusant would be required in the ampoule apart from the wafer. The ampoule containing the semiconductor material and the diffusant or diffusants is evacuated and then sealed. The ampoule then is placed in a furnace sufficient for diffusion of impurities into indium antimonide. For indium antimonide, this would be approximately 450°C. The time of diffusion would be about two hours. As illustrated in FIG. 1 with cadmium and copper as impurities during the diffusion of indium antimonide, the cadmium penetrates approximately one micron and the copper penetrates to about three microns to provide a P-N junction. It should be understood that cadmium, zinc or mercury under appropriate conditions could be utilized to provide the impurity gradient or profile as illustrated in FIG. 1.

As illustrated in FIG. 2, the diode has a contact 1 to the P-type material and the contact 2 to the N-type material. The contacts are made by any well-known technique, for example, alloyed ohmic contacts may be made to the indium antimonide by utilizing pure indium as the alloy.

The following is a specific example of an indium antimonide photovoltaic diode made according to the invention. A 0.05 ohm-cm. N-type indium antimonide wafer was etched in one part nitric acid and three parts saturated tartaric acid for one minute, and then rinsed in deionized water. The indium antimonide wafer was sealed along with one gram of a 1% cadmium and 99% indium alloy in a previously cleaned quartz tube. In this example, sufficient copper remained on the wafer after the cleaning process to provide the fast diffusing, low solid solubility copper impurity. The quartz tube was cleaned by rinsing with water, etching in hydrofluoric acid to remove the surface layer of quartz, soaking in 0.5 N potassium hydroxide to remove silicon freed by hydrofluoric acid, rinsing in deionized water and dilute hydrochloric acid to remove residual potassium hydroxide and then further rinsing in deionized water. The quartz tube containing the indium antimonide and the cadmium diffusion source was evacuated and sealed. The quartz tube was then placed in a diffusion oven, maintained at a temperature of about 400°C. and allowed to remain at that temperature for 2 hours and 5 minutes. Thermal diffusion and cadmium diffusion occurred simultaneously. After diffusion, the semiconductor wafer with a P-N junction therein had varying impurity concentrations as illustrated in FIG. 1. Ohmic contacts were then made to the P-type material and the N-type material using indium as the solder. The complete device was tested and determined to have a uniform sensitivity over its entire active surface (note FIG. 2). The device was tested and had an increased signal quantum efficiency over indium antimonide photovoltaic diodes made by normal diffusion techniques.

Although the invention has been disclosed by the single preferred embodiment of indium antimonide, it should be appreciated that it is applicable not only to indium antimonide photovoltaic diodes, but all Group III–V compound semiconductors, such as gallium arsenide, indium antimonide, indium arsenide, as well as silicon and germanium semiconductors. The invention may be utilized with various elements and compounds which are useful in making photovoltaic diodes.

Further it should be understood that the original wafer may be of N-type or P-type conductivity. The photovoltaic diodes made from either conductivity type will have the impurity profile or gradient as illustrated in FIG. 1, but the conductivity types will be different in each.

Moreover, the invention is useful for making solar cells or other such devices wherein it is desirable to increase the signal quantum efficiency.

Although the invention has been disclosed by the single preferred embodiment of indium antimonide with suggested changes and modifications, still further changes and modifications will suggest themselves to those skilled in the art, and such further changes and modifications are within the scope of the invention which is limited only by the appended claims.

What is claimed is:

1. A photovoltaic diode comprising a semiconductor body of a Group III–V semiconductor material of one conductivity type having disposed within a region thereof a first impurity of the opposite conductivity type forming a P-N junction within said body, said first impurity being copper and having a concentration comprising a first decreasing gradient from the surface of said region to the P-N junction, said region having disposed within a relatively thin surface region thereof spaced from said P-N junction a relatively high concentration of a second impurity of said opposite conductivity type, said second impurity being selected from the group consisting of cadmium, zinc, and mercury, and the concentration of said second impurity comprising a second decreasing gradient from said surface to the depth of said thin surface region.

2. The photovoltaic diode of claim 1 wherein said semiconductor body is indium antimonide.

3. The photovoltaic diode of claim 1 wherein the concentration of said first impurity substantially corresponds to the curve labeled "thermal or copper concentration level" in the graph of FIG. 1 and wherein the concentration of said second impurity substantially corresponds to the curve labeled "cadmium concentration" in the graph of FIG. 1.

4. The photovoltaic diode of claim 1 wherein said region is on the order of three microns thick and said thin surface region is on the order of one micron thick.

5. An indium antimonide photovoltaic diode comprising:

a. a first region of uniform N-type conductivity;

b. a copper-diffused P-type conductivity region contiguous with said uniform N-type conductivity region and forming a P-N junction therewith;

c. a cadmium-diffused region contiguous with a surface of said copper-diffused region spaced from said P-N junction, said cadmium-diffused region having a substantially higher conductivity than said copper-diffused region and being substantially thinner than said copper-diffused region; and d. ohmic contacts electrically respectively connected to said cadmium-diffused region and to said N-type conductivity region.

6. A photovoltaic diode comprising a semiconductor body of a Group III–V semiconductor material of one conductivity type having disposed within a region thereof a first impurity of the opposite conductivity type forming a P-N junction within said body, said first impurity being copper and having a concentration comprising a first decreasing gradient from the surface of said region to the P-N junction, a relatively thin active surface region contiguous with said surface and spaced from said P-N junction, said active surface region being defined by a relatively high concentration of a second impurity of said opposite conductivity type, said second impurity being selected from the group consisting of cadmium, zinc, and mercury, and said thin active surface region defined by said second impurity having a second decreasing conductivity gradient of said opposite conductivity type in which the highest conductivity is substantially higher than the highest conductivity of said first decreasing gradient of said first impurity.

7. The photovoltaic diode of claim 6, wherein said second impurity is cadmium.

* * * * *